United States Patent [19]

Bowen

[11] Patent Number: 5,340,510

[45] Date of Patent: Aug. 23, 1994

[54] METHOD FOR MAKING PIEZOELECTRIC CERAMIC/POLYMER COMPOSITE TRANSDUCERS

[75] Inventor: Leslie J. Bowen, Concord, Mass.

[73] Assignee: Materials Systems Incorporated, Concord, Mass.

[21] Appl. No.: 42,878

[22] Filed: Apr. 5, 1993

[51] Int. Cl.$^5$ .............................. C04B 41/83
[52] U.S. Cl. ....................... 264/22; 264/61; 264/62; 264/328.2; 264/272.16
[58] Field of Search ............... 264/61, 328.2, 22, 62, 264/272.16

[56] References Cited

U.S. PATENT DOCUMENTS 4,345,955 8/1982 Bakermans ..................... 264/61

OTHER PUBLICATIONS

B. Jaffe et al., *Piezoelectric Ceramics*, Academic Press, London, N.Y., 1971, Ch. 5, 7, 8.
R. E. Newnham et al., *Materials in Engineering*, 93–106 (Dec. 1980).
U. Bast et al., *Ceramics Today-Tomorrow's Ceramics*, Proc. 7th CIMTEC, Terme, Italy, 1990 (Publ. *Mat. Sci. Monographs*, 66C, P. Vincenzini, ed., Elsevier Sci. Pr., N.Y., 1991).
G. Preu et al., *Proc. ECERS 2 Conference* (Sep. 1991, Augsberg, FRG) (In press copy, Publication date unknown).
J. A. Hossack et al., *IEEE Transactions on Ultrasonics, Ferroelectrics, and Frequency Control*, 38, [6] 618–629 (Nov. 1991).
Darrah et al., *Proc. ADPA/AIAA/ASME/SPIE Conf. on Active Mat. & Adaptive Structures*, 139–142 (1992) (Presented Alexandria, Va., 1991).
L. J. Bowen et al., *Proc. IEEE 8th Int. Symp. on Applications of Ferroelectrics*, pp. 160–163 (1993). (Presented Greenville, S.C., Sep. 1, 1992).

*Primary Examiner*—James Derrington
*Attorney, Agent, or Firm*—Frances P. Craig

[57] ABSTRACT

A net-shape process for fabricating a fully dense ceramic preform for a piezoelectric or electrostrictive composite transducer exhibiting 1-3 or 2-2 connectivity. The process involves preparing a homogeneous, granulated, thermoplastic powder/binder mixture from a strongly piezoelectric or electrostrictive ceramic material powder and a thermoplastic organic binder selected to be nondestructively removed from the mixture by heating. The mixture is injection molded to form a self-supporting green body including a planar ceramic base with parallel ceramic elements extending perpendicularly from the base in a preselected array. Each element has a rod-like or lamellar shape. The body is released from the preform mold, heated to a temperature of 300°–700° C. for a time sufficient to completely remove the binder, and sintered to at least about 95% of theoretical density. To fabricate a piezoelectric or electrostrictive composite transducer exhibiting 1-3 or 2-2 connectivity and including a fully dense piezoelectric or electrostrictive ceramic phase, the preform is encapsulated in a polymeric material to form a 2-phase ceramic/polymer composite. The ceramic base is removed from the lower planar surface of the composite and the elements are exposed at each of the upper and lower planar surfaces. The composite is electroded to establish electrical contact with the elements. The elements may be poled to produce a piezoelectric composite transducer exhibiting 1-3 or 2-2 connectivity.

14 Claims, 5 Drawing Sheets

METHOD FOR MAKING PIEZOELECTRIC CERAMIC/POLYMER COMPOSITE TRANSDUCERS

This invention was made as a result of work under Contract No. N00014-92-C-0010 awarded by the U.S. Department of the Navy. The Government has certain rights in this invention.

BACKGROUND OF THE INVENTION

This invention relates to fabrication of piezoelectric transducers, and more particularly to a method for making piezoelectric ceramic/polymer composite transducers.

Electromechanical transducers are used for the interconversion of electrical and mechanical energy in acoustic applications. These applications include, but are not limited to, resonators, acoustic signal detectors, acoustic projectors and ultrasonic imaging. Typically, the acoustically active element in such transducers is made from a piezoelectric ceramic material such as lead zirconate titanate (PZT), lead magnesium niobate (PMN), or similar strongly piezoelectric material. (See, for example, B. Jaffe et al., Piezoelectric Ceramics, Academic Press, London, N.Y., 1971, particularly Chs. 5, 7, and 8.) In some applications, composites of piezoelectric ceramic fibers or sheets in a polymer or plastic matrix are more effective transducers than solid ceramic material. Many such piezoelectric ceramic/polymer combinations have been described in the literature, and some have found commercial application. In particular, fine-scale piezoelectric ceramic fibers or strips separated by an organic polymer phase are used in medical ultrasound and acoustic nondestructive evaluation. Other applications include hydrophones, that is lightweight large area actuators for use in a water environment, where the composite allows improved acoustic coupling to water or body fluids compared with solid ceramic transducers. (R. E. Newnham et al., "Composite Piezoelectric Transducers", Materials in Engineering 2, 93–106 (December 1980); J. A. Hossack et al., "Finite Element Analysis of 1-3 Composite Transducers", IEEE Transactions on Ultrasonics, Ferroelectrics, and Frequency Control 38 [6]618–629 (November 1991). Newnham et al. is incorporated herein by reference.)

Many composite configurations have been constructed and evaluated on a laboratory scale over the past thirteen years. One of the most successful combinations has a one-dimensionally connected ceramic phase (e.g., PZT fibers) contained within a three-dimensionally-connected matrix provided by an organic polymer phase. This combination is known in the art as a 1-3 composite. (Newnham et al, supra, p. 95.) Hydrophone figures of merit (Newnham et al, supra, p. 93.) for this composite can be made over 10,000 times greater than those of solid PZT ceramic by appropriately selecting the phase characteristics and composite structure. Another important configuration is two dimensionally-connected strips of PZT ceramic separated by two-dimensionally-connected parallel strips of polymer, designated a 2-2 composite. (Newnham et al, supra, p. 95.). This configuration is widely used in phased array type transducers.

For high frequency applications, for example ultrasonic imaging, the piezoelectric ceramic elements in the composite must have extremely small dimensions (for example 20–200 $\mu$m diameter) for sufficiently high frequencies to be attained. The fineness of these composite array elements makes composite manufacturing extremely difficult.

Early composites were fabricated by hand-aligning extruded PZT ceramic rods in a jig and encapsulating in epoxy resin, followed by slicing to the appropriate thickness and poling of the ceramic rods. (Newnham et al., supra, pp. 98–99.) This approach demonstrated the performance advantages of this material, but also highlighted the difficulties involved in fabricating 1-3 composites on a large scale, even for prototype purposes. These difficulties include: (1) the requirement to align and support large numbers of PZT fibers during encapsulation by the polymer, and (2) the high incidence of dielectric breakdown during poling arising from the significant probability of encountering one or more defective fibers in a typical large array.

Several attempts have been made to demonstrate more viable manufacturing processes. A procedure has been developed for assembling composites from extruded PZT fibers using automated fiber placing and assembly. This approach is effective for coarse composites having fibers of approximately 0.5–1 mm diameter, which are strong enough to be machine handled. For finer scale composites, a typical practice is to dice the ceramic composite structure from solid ceramic using a wafer dicing saw. In this case, a portion of the solid ceramic piece is left intact as a support for the PZT fiber array. (Hossack et al., supra, pp. 621–625.) While this technique can be used to fabricate fine structures having ceramic elements under 50 $\mu$m across, the process yield becomes lower as the element dimensions are reduced, due to the presence of defects in the ceramic or limitations in the capability of the sawing process itself. In addition, this process does not readily allow the fabrication of ceramic elements which have special shapes since the sawing process is limited to straight cuts.

Recently attempts have been reported to fabricate such composite transducers by a net shape slip casting process. (U. Bast et al., "A new Technique for the Production of Piezoelectric Composites with 1-3 Connectivity", Ceramics Today—Tomorrow's Ceramics, Proc. 7th CIMTEC—World Ceramics Congress, Terme, Italy, Jun. 24–30, 1990, published in Materials Science Monographs, 66C, P. Vincenzini, Ed. Elsevier Science Press, N.Y., 1991.) In this slip casting process, a disposable plastic tool containing holes is fabricated for use as a template or support for forming a liquid slurry of PZT powder into the desired preform shape. During the ceramic firing process the plastic tool is burned away leaving a porous PZT fiber array which is then sintered to achieve a dense product. However, this process has the disadvantage that it requires a new plastic tool for each ceramic part that is fabricated, leading to high tooling cost.

BRIEF DESCRIPTION OF THE DRAWINGS

For a better understanding of the present invention, together with other objects, advantages, and capabilities thereof, reference is made to the following Description and appended Claims, together with the Drawings, in which:

SUMMARY OF THE INVENTION

In accordance with one aspect of the invention, a net-shape process for fabricating a fully dense ceramic preform for a piezoelectric or electrostrictive composite transducer exhibiting 1-3 or 2—2 connectivity involves preparing a homogeneous, granulated, thermoplastic powder/binder mixture including a ceramic powder selected from the strongly piezoelectric or electrostrictive ceramic materials and sufficient thermoplastic organic binder to render the mixture moldable by injection molding. The binder is selected to render the mixture thermoplastic during injection molding at that solids loading and to be nondestructively removed from the mixture by heating. A green body of the preform is formed by injection molding the mixture in an injection molding apparatus including a preform mold which is a negative of the preform green body and cooling the green body in the preform mold sufficiently to be releasable from the preform mold as a self-supporting green body. The green body includes a planar ceramic base and a plurality of parallel ceramic elements integral with and extending perpendicularly from the base in a preselected array and fixedly supported in the array by the base. Each element has a rod-like or lamellar shape. The self-supporting green body is released from the preform mold, and is heated to a temperature of 300°–700° C. for a time sufficient to completely remove the binder from the green body. The binder-removed body is sintered at a temperature and for a time sufficient to densify the body to at least about 95% of theoretical density to produce a fully dense preform. In accordance with another aspect of the invention, the fully dense preform may be used to fabricate a piezoelectric or electrostrictive composite transducer exhibiting 1-3 or 2-2 connectivity and including a fully dense piezoelectric or electrostrictive ceramic phase. The process further involves encapsulating the fully dense elements of the preform in a polymeric material to form a 2-phase ceramic/polymer composite having upper and lower planar surfaces. The lower planar surface includes the ceramic base. The ceramic base is removed from the lower planar surface and the fully dense elements are exposed at each of the upper and lower planar surfaces. The composite is electroded at the upper and lower surfaces such that electrodes establish electrical contact with opposing surfaces of each of the fully dense elements. In a narrower aspect, the fully dense elements are poled in a high electric field at a temperature just below the Curie temperature of the ceramic material for a time sufficient to produce a piezoelectric composite transducer exhibiting 1-3 or 2—2 connectivity.

DETAILED DESCRIPTION OF THE PREFERRED EMBODIMENTS

Described herein is a process exemplary of one aspect of the invention, in which a ceramic fiber or strip (lamellar) preform (for a 1-3 or 2—2 composite, respectively) is fabricated by injection molding a near net-shape body utilizing reusable tooling. After binder removal, the body is sintered to produce the desired net shape preform. To produce a piezoelectric or electrostrictive transducer, the preform is then encapsulated in a polymer matrix and machined to remove excess material. Electrodes are then applied in known manner. Poling of the ceramic phase may be performed in known manner to produce a piezoelectric transducer.

In this exemplary process, injection molding is used as the means to form the PZT powder into the composite preform shape. Injection molding is widely used in the plastics industry as a means for rapid mass production of complex shapes at low cost. The fabrication of ceramics is a relatively recent application of injection molding technology, and has been most successful for shapes, e.g. thread guides, of small cross-section and for large, complex shapes which do not require sintering to high density, e.g. turbine blade casting inserts.

In the present process, a hot thermoplastic mixture of a PZT ceramic powder and organic binder is injected under pressure into a cooled mold, permitting fabrication of complex shapes with the ease and rapidity normally associated with plastics molding. The PZT powder typically, but not necessarily, is doped with a fraction of a percent of a donor or acceptor component to enhance its piezoelectric properties or to tailor its properties to suit the intended application. Typical dopants include iron, niobium, lanthanum, and other rare earth elements. The powder is typically added to the mixture at a high solids loading, e.g., >50 volume %. The organic binder is removed from the molded bodies nondestructively by slow binder removal over a period of approximately 10–100 hours. Nondestructive binder removal is aided by a high solids loading in the injection molded mixture. Once the binder is removed, the subsequent firing, poling, and polymer encapsulation processes are similar to those used for conventional PZT/polymer composites.

The preferred process for fabricating such a PZT ceramic preform uses shaped tool inserts to allow changes in part design without incurring excessive retooling costs. The elements are molded on an integral ceramic base, which can be removed after the sintering and polymer encapsulation process steps have been completed. If needed, individual preforms can be configured together, that is the bases can be machined and butted edge to edge, to form larger arrays of PZT fibers or strips.

Figure 1:
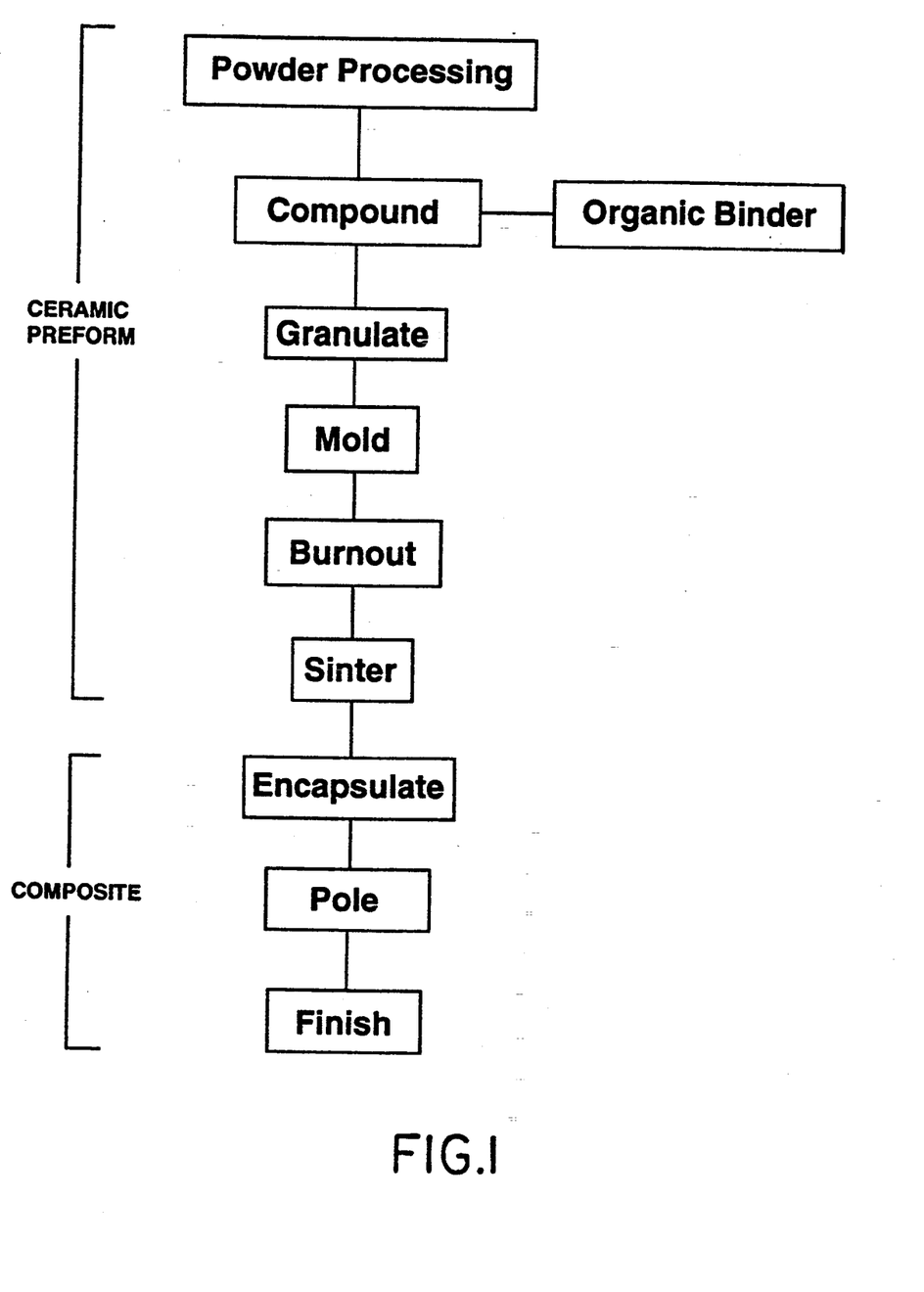
FIG. 1 is a flow chart illustrating typical steps in a process in accordance with one embodiment of the invention.

The process steps are shown in the flow chart of FIG. 1. The PZT powder may be milled if desired to achieve a desired grain size and distribution. The powder is then homogeneously mixed in a solids loading of at least about 50% by volume in a heated mixer with a thermoplastic organic binder. The mixer should be heated to at least the melting point of the binder. The binder is selected to provide with the powder a hot thermoplastic mixture suitable for injection molding, and to be removed by slow heating with no residue deleterious to the fabrication process. Examples of suitable binders are waxes such as paraffin wax, polypropylene, and polyethylene. The mixture may be cooled and granulated before molding.

The granulated mixture is injection molded using conventional apparatus fitted with a specifically designed mold. Typically, injection molding pressure is about 50–20,000 psi. Preferably all surfaces contacting the hot mixture are selected to be non-reactive therewith. Exemplary mold assembly 10 is shown schematically in FIG. 2. Tool body 12 includes cavity portion 14 enclosing cavity 16. Tool body 12 also includes sprue portion 18, through which sprue 20 permits filling of cavity 16 during the injection molding process. Removably positioned within cavity 16 is replaceable insert 22 which, with cavity 16, defines mold 24. Mold 24 is a negative of the desired preform, described below. Conveniently, insert 22 may be one of a set of interchangeable inserts (not shown) of different shapes for assembling with cavity 16 to provide molds of different designs.

Figure 2:
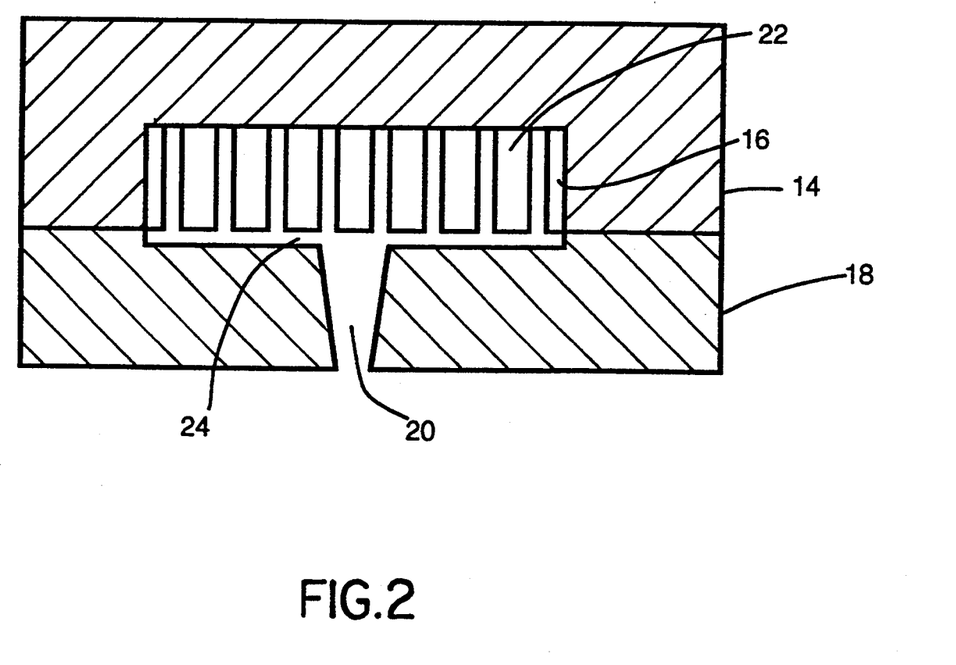
FIG. 2 is a schematic cross-sectional front view of a mold used in the process in accordance with one embodiment of the invention.

The mixture is heated sufficiently by the injection molding process to remelt the binder allowing the mixture to completely fill cavity 16 and to conform to mold 24. Mold 24 is sufficiently cool to produce a shape-retaining green body having a shape near to but slightly larger than that of the preform. A typical preform size is about 50×50 mm. Normally, a small amount of molding shrinkage is expected. In some cases, it may be advisable to limit of the size of the preform to minimize the possibility of shearing off the outermost elements during the cooling portion of the molding cycle. Any such size limitation is empirically determined. Fabrication of larger transducers is described below. Of course, mold 24 is also designed for ease of removal of the shaped preform, producing a preform having straight-sided or tapered elements without obstruction to removal of the preform from the mold. After release of the preform, mold 24 may be reused, with the same or a different insert, to produce another preform by the same injection molding process.

Figure 3:
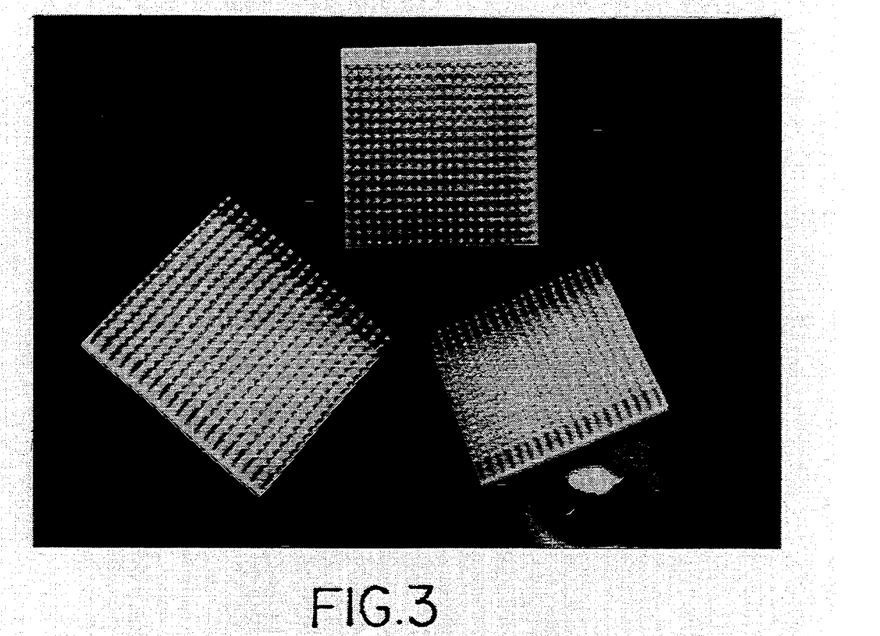
FIG. 3 is a photograph of 1–3 type preforms fabricated by the process in accordance with another embodiment of the invention.

The injection molded green body is illustrated in FIG. 3. The green body includes rod-shaped ceramic elements disposed in a regular array on and extending perpendicularly outward from one planar surface of a supporting ceramic base. The individual elements are separated from one another by a void space. The distance between elements is the so-called "trench width". Extending outwardly from the opposing planar surface of the base is a stem, not shown in FIG. 3, conforming to the shape of the mold sprue. The stem typically is removed immediately after molding. The size and shape of each element, the trench width, and the design of the array of elements on the base in the injection molded green body are empirically determined to allow for shrinkage during the binder burnout and densification steps, to produce a sintered preform having a geometry selected in accordance with known principles to produce the intended transducer characteristics. Two sintered preforms are also shown in FIG. 3. Typical sintered preform cross-sectional shapes for rod-shaped elements include cylindrical, square, rectangular, triangular, and hexagonal, and the elements may be straight-sided or tapered. Typical sizes for the elements are diameters, or equivalent diameters, of about 20–200 $\mu$m and aspect ratios (length to diameter) of at least about 3:1 up to about 20:1. The trench width is typically 20–5000 $\mu$m. The thickness of the base is selected to provide rigid support for the element array during processing, and the base typically extends at each edge about one-half of the trench width beyond the outermost elements.

The green body is heat treated at a temperature slightly above the decomposition temperature of the binder for a time sufficient to completely remove the binder. For a paraffin wax binder, for example, a typical burnout step involves a temperature of about 300°–700° C. and a time of about 10–100 hr. It is important to successful preform fabrication that the binder burnout be nondestructive, i.e. that the removal of the binder be accomplished leaving no cracks or voids in the burned out body large enough to cause failure in the sintered preform or to interfere with the operation of the transducer fabricated therefrom. As mentioned above, such nondestructive removal depends on such factors as selection of the binder and the parameters selected for the binder burnout heating step.

The binder-removed preform is then densified to full density, i.e. at least about 95%, and preferably at least about 97%, of the theoretical density in a manner conventional for producing fully dense ceramics. (See, for example, Newnham et al., supra, p. 98; Bast et al., supra, p. 2012; L. J. Bowen et al., Presentation, ISAF 92, 8th Int. Symposium on Applns. of Ferroelectrics, Clemson, SC, Sep. 1, 1992, Published March 1993. Bowen et al. is incorporated herein by reference.) A typical heating cycle suitable for sintering the preform include sintering in a PbO-rich atmosphere at 1100°–1400° C. for 0.1–4 hr. Optionally, the preform may be further densified by hot isostatic pressing (HIPing) after sintering, for example at about 1100°–1400° C. and about 200–30,000 psi for about 0.1–4 hr. Conventional sinter-HIPing using similar parameters is also a suitable method for densifying the preform.

Figure 4:
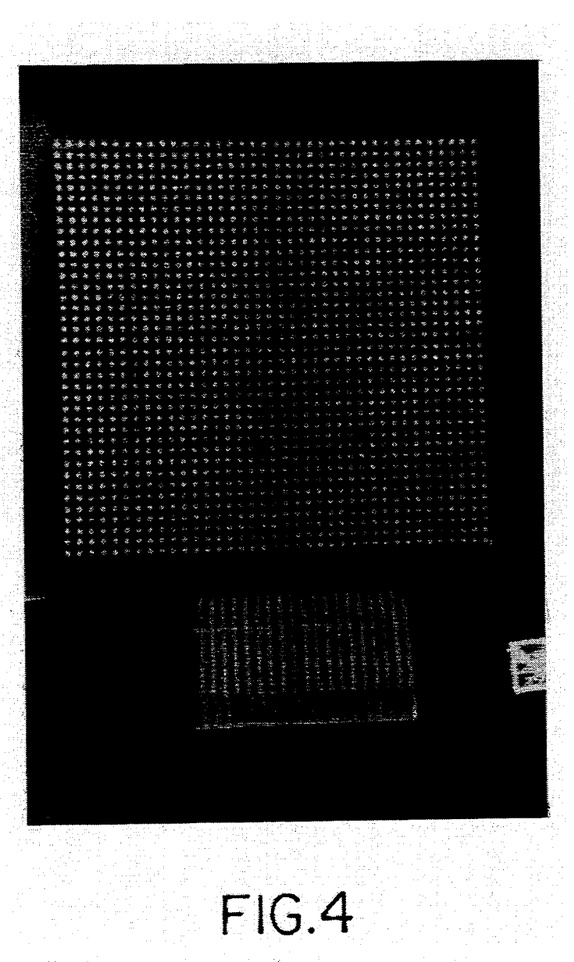
FIG. 4 is a photograph of a 1–3 composite fabricated in accordance with yet another embodiment of the invention.

The fully dense preform including the array of elements supported by the integral base is then encapsulated in known manner to create a rigid or flexible polymeric second phase matrix surrounding the elements and filling the void space therebetween. (See, for example, Newnham et al., supra, p. 99; Hossack et al., supra, p. 621.) A typical encapsulation process involves pouring of a freshly compounded epoxy resin mixture, under vacuum, over the preform inverted in a mold slightly larger and deeper than the preform, allowing the epoxy resin to solidify, and removing the resulting composite structure from the mold. The composite is then machined to expose the element ends and, typically, to remove the supporting ceramic base of the preform. Such a 1-3 composite is shown in FIG. 4. The photograph of FIG. 4 illustrates the rod or fiber shaped piezoelectric elements from the preform embedded in parallel relation to one another in the polymeric matrix to form the 1-3 composite. The composite may then be electroded in known manner, for example by depositing a conventional electrode material, such as silver, gold, palladium,, or an electrically conductive polymer, on the planar surfaces to establish electrical contact with the ceramic elements.

To render the device strongly piezoelectric, the elements may then be "poled" in known manner, i.e. a strong electric field is applied to the elements at a temperature just below the Curie temperature, to create a polar axis. (See, for example, Newnham et al., supra, p. 102.) Alternatively, the poling may be performed on the preform before encapsulation in the polymeric matrix.

Figure 5:
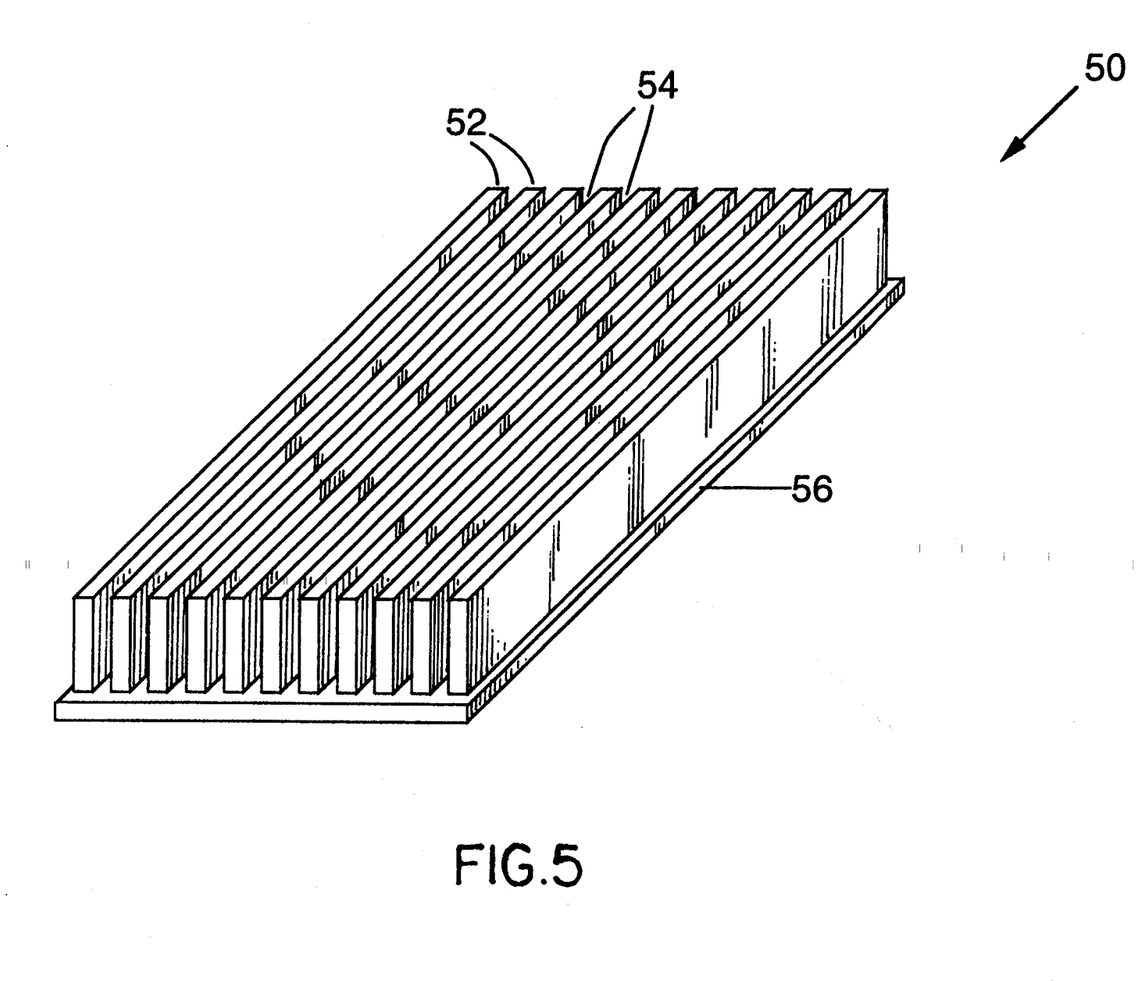
FIG. 5 is a schematic perspective view of a 2—2 type preform fabricated by the process in accordance with still another embodiment of the invention.
Figure 6:
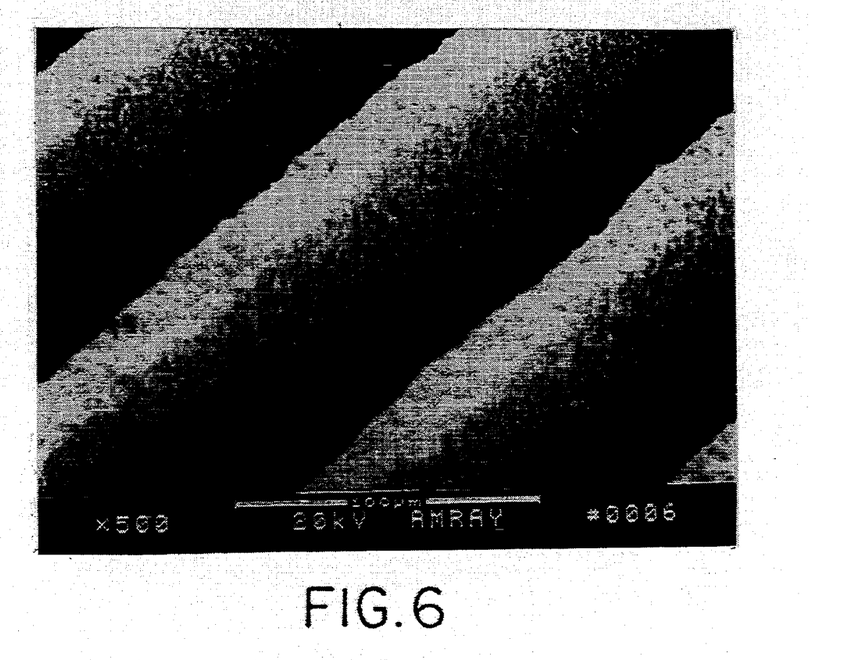
FIG. 6 is a photomicrograph of a fine-scale 2—2 composite preform fabricated in accordance with the embodiment of FIG. 5.

Alternatively, preform mold 24 may be configured to produce a preform for a 2—2 composite. A typical ceramic preform for a 2—2 composite is illustrated schematically in FIG. 5, showing preform 50 including an array of parallel, planar ceramic elements 52 separated by parallel void spaces, or trenches, 54. Planar elements 52 are supported by planar ceramic base 56. FIG. 6 is a photomicrograph of a fine-scale 2—2 composite preform, which is suitable to be molded, sintered, and encapsulated with polymer as described above for the 1-3 composite. PZT/polymer lamellar 2—2 composites prepared by this process have been achieved exhibiting ceramic layers as thin as 30 $\mu$m. The 2—2 composite is then machined to remove the ceramic base and to expose the outer planar surfaces of the outermost elements, and these outer surfaces are electroded in a manner similar to that described above for the 1-3 composite. The composite may be poled in the manner described above.

The individual preforms described above are about 50×50 mm in element array size. However, larger arrays may be fabricated. In one method, the outer edges of the ceramic bases of several densified preforms may be machined, if necessary, to remove excess base material, and the bases placed adjacent to one another in a coplanar arrangement, for example by butting the adjacent edges together, to fill an encapsulation mold of the required size. After encapsulation, the bases may be machined away, leaving the desired large array of encapsulated elements. The 1-3 composite illustrated in FIG. 4 was fabricated by this method using 4 ceramic preforms, each about 50×50 mm.

Although the ceramic material described above is lead zirconate titanate (PZT), such materials as lead magnesium niobate (PMN) and similar strongly piezoelectric or electrostrictive materials such as barium titanate, lead titanate, strontium titanate, bismuth titanate, and their derivatives are also suitable for fabrication by the injection molding method described herein. Suitable matrix materials depend on the application to which the fabricated device is directed and on their capability to provide an integral matrix using the above-described encapsulation process. Such materials include both rigid and flexible polymeric materials, for example, epoxy resins, polyurethanes, and elastomers.

The following Example is presented to enable those skilled in the art to more clearly understand and practice the present invention. This Example should not be considered as a limitation upon the scope of the present invention, but merely as being illustrative and representative thereof.

EXAMPLE

Piezoelectric composites consisting of parallel-oriented PZT fibers in a polymer matrix (1-3 configuration) were fabricated by injection molding using the process described. Rare earth donor-doped PZT powder (Morgan Matroc, Inc., Bedford, Ohio, designation PZT-5H) was mixed with paraffin wax in a heated mixer at a temperature above the melting point of the wax for sufficient time (approximately one to eight hours) to form a homogeneous mixture. After cooling, the mixture was granulated into small pieces and fed into an injection molding machine fitted with a mold. The mold contained a cavity having an open base approximately 50 mm square, which contained a replaceable tool including 361 fiber-shaped open cavities approximately 1 mm diameter and 10 mm long. The resulting assembly provided a cavity shaped as the negative of the "bristle-board" shaped part to be molded. The injection molding process remelted the PZT-wax mixture allowing the mixture to fill the cavity fully under pressure. Metal surfaces of the apparatus exposed to the hot PZT mixture were hard-faced to minimize contamination of the mixture.

Following the molding step, the PZT/wax preform was removed from the mold, the stem formed by the sprue was removed, and the preform was placed in an oven and heated slowly over a two-day period until the wax had fully burned away. The resulting porous PZT preform was then placed in a closed ceramic crucible and heated to a temperature in the range 1200° to 1300° C. until densification was completed, cooled down and removed as a dense ceramic preform.

To complete the composite fabrication procedure, preforms made in this manner were embedded in either epoxy resin or polyurethane polymer depending on application requirements. The final process steps were to grind away the ceramic base plate, apply metal electrodes to the ends of the exposed PZT elements, and pole the ceramic under high electric field of 20-25 kV/cm at about room temperature to about 110° C.

Using this technique, PZT ceramic preforms having both 1-3 and 2—2 geometry were fabricated with PZT element dimensions as small as 25 $\mu$m and as large as 1.5 mm wide. Piezoelectric and dielectric properties of injection molded PZT piezoelectric ceramic 1-3 composites are compared with those of the die pressed bulk material in the Table below. The comparable properties shown in the Table demonstrate that iron contamination of the molded mixture is minimal, and that excellent piezoelectric and dielectric properties are maintained using this process.

TABLE

| Specimen Type | Relative Permittivity | Dielectric Loss | d33 (pC/N) |
| --- | --- | --- | --- |
| Die-Pressed | 3584 | 0.018 | 745 |
| Injection Molded | 3588 | 0.018 | 755 |

The novel process described herein utilizes reusable tool inserts which are easily interchanged for variation of preform design. The self-supporting preform green body is released from the tool before binder removal and sintering. Full density is readily achieved in the preform body by commercially viable sintering processes using existing sintering equipment. The process also offers many other advantages over alternative fabrication routes: complex, near net-shape capability for handling many fibers simultaneously; rapid throughput (typically minutes per part); flexibility with respect to transducer design (allows variation in PZT element spacing and shape); and lower cost in moderate volume production because the tooling used to form the part can be reused and its cost spread over many parts.

While there have been shown and described what are at present considered the preferred embodiments of the invention, it will be obvious to those skilled in the art that various changes and modifications can be made therein without departing from the scope of the invention as defined by the appended Claims.

What is claimed is:

1. A net-shape process for fabricating a fully dense ceramic preform for a piezoelectric or electrostrictive composite transducer exhibiting 1-3 or 2—2 connectivity, said process comprising the steps of:
   preparing a homogeneous, granulated, thermoplastic powder/binder mixture comprising ceramic powder selected from the group consisting of strongly piezoelectric or electrostrictive ceramic materials and sufficient thermoplastic organic binder to render said mixture moldable by injection molding, said binder being selected to render said mixture thermoplastic during injection molding and to be nondestructively removed from said mixture by heating;

forming a green body of said preform by injection molding said mixture in an injection molding apparatus comprising a preform mold which is a negative of said preform green body and cooling said green body in said preform mold sufficiently to be releasable from said preform mold as a self-supporting green body, wherein said green body comprises a planar ceramic base and a plurality of parallel ceramic elements integral with and extending perpendicularly from said base in a preselected array and fixedly supported in said array by said base, each of said elements having a shape selected from the group consisting of rod-like and lamellar;

releasing said self-supporting green body from said preform mold;

heating said released green body to a temperature of 300°–700° C. for a time sufficient to completely remove said binder from said green body; and sintering said binder-removed body at a temperature and for a time sufficient to densify said binder-removed body to at least about 95% of theoretical density to produce a fully dense preform.

2. A net-shape process for fabricating a piezoelectric or electrostrictive composite transducer exhibiting 1-3 or 2—2 connectivity and including a fully dense piezoelectric ceramic phase, said process comprising the steps of:

preparing a homogeneous, granulated, thermoplastic powder/binder mixture comprising ceramic powder selected from the group consisting of strongly piezoelectric or electrostrictive ceramic materials and sufficient thermoplastic organic binder to render said mixture moldable by injection molding, said binder being selected to render said mixture thermoplastic during injection molding and to be nondestructively removed from said mixture by heating;

forming a preform green body by injection molding said mixture in an injection molding apparatus comprising a preform mold which is a negative of said preform green body and cooling said green body in said preform mold sufficiently to be releasable from said preform mold as a self-supporting green body, wherein said green body comprises a planar ceramic base and a plurality of parallel ceramic elements integral with and extending perpendicularly from said base in a preselected array and fixedly supported in said array by said base, each of said elements having a shape selected from the group consisting of rod-like and lamellar;

releasing said self-supporting green body from said preform mold;

heating said released green body to a temperature of 300°–700° C. for a time sufficient to completely remove said binder from said green body;

sintering said binder-removed body at a temperature and for a time sufficient to densify said binder-removed body to at least about 95% of theoretical density to produce a preform in which said elements are fully dense;

encapsulating said fully dense elements in a polymeric material to form a 2-phase ceramic/polymer composite having upper and lower planar surfaces, said lower planar surface comprising said ceramic base;

removing said ceramic base from said lower planar surface and exposing said fully dense elements at each of said upper and lower planar surfaces; and electroding said composite at said upper and lower surfaces such that electrodes establish electrical contact with opposing surfaces of each of said fully dense elements.

3. A process in accordance with claim 2 further comprising the step of poling said fully dense elements in a high electric field at a temperature just below the Curie temperature of said ceramic material for a time sufficient to produce a piezoelectric composite transducer exhibiting 1-3 or 2—2 connectivity.

4. A process in accordance with claim 2 wherein said ceramic material is a lead zirconate titanate or derivative thereof.

5. A process in accordance with claim 2 wherein said ceramic material is a lead magnesium niobate or derivative thereof.

6. A process in accordance with claim 2 wherein said ceramic material is a barium titanate or derivative thereof.

7. A process in accordance with claim 2 wherein said polymeric material is a flexible polymeric material.

8. A process in accordance with claim 2 wherein said polymeric material is a rigid polymeric material.

9. A process in accordance with claim 2 wherein said polymeric material is a polyurethane.

10. A process in accordance with claim 2 wherein said polymeric material is an epoxy resin.

11. A process in accordance with claim 2 wherein said polymeric material is an elastomer.

12. A process in accordance with claim 2 wherein said preform mold comprises a mold body having a mold cavity and a removable, reusable insert disposed in said cavity, said cavity and said insert cooperating to provide said negative of said preform green body.

13. A process in accordance with claim 12 wherein said removable, reusable insert is one of a set of interchangeable removable, reusable inserts each of a geometry to provide in cooperation with said cavity a different green body design.

14. A process in accordance with claim 2 wherein:

said encapsulating step comprises forming a preform array consisting of a plurality of like preforms disposed with said bases of said preforms coplanar with one another and with edges of adjacent preform bases adjacent one another, and encapsulating said elements of said preform array in a polymeric material to form a 2-phase ceramic/polymer composite having upper and lower planar surfaces, said lower planar surface comprising said coplanar bases; and said base removing step comprises removing said ceramic bases from said lower planar surface and exposing said fully dense elements at each of said upper and lower planar surfaces.

* * * * *